United States Patent
Zarubinsky et al.

(10) Patent No.: US 6,181,168 B1
(45) Date of Patent: Jan. 30, 2001

(54) HIGH SPEED PHASE DETECTOR AND A METHOD FOR DETECTING PHASE DIFFERENCE

(75) Inventors: Michael Zarubinsky, Jerusalem; Eliav Zipper, Ramat Gan; Leonid Tsukerman, Haifa, all of (IL)

(73) Assignee: Motorola, Inc., Schaumburg, IL (US)

( * ) Notice: Under 35 U.S.C. 154(b), the term of this patent shall be extended for 0 days.

(21) Appl. No.: 09/405,191

(22) Filed: Sep. 24, 1999

(51) Int. Cl.[7] .................................................. H03D 13/00
(52) U.S. Cl. ................................. 327/12; 327/7; 327/3; 327/2
(58) Field of Search .................... 327/2, 3, 7, 8, 327/12

(56) References Cited

U.S. PATENT DOCUMENTS

| | | | |
|---|---|---|---|
| 4,380,742 | 4/1983 | Hart | 331/1 A |
| 5,079,521 | 1/1992 | Gaskell et al. | 331/1 A |
| 5,105,160 | 4/1992 | Summers | 327/7 |
| 5,111,151 | 5/1992 | Li | 327/159 |
| 5,168,245 | 12/1992 | Koskowich | 331/1 A |
| 5,173,617 | 12/1992 | Alsup et al. | 327/158 |
| 5,268,653 | 12/1993 | Lafon | 331/1 A |
| 5,347,234 | 9/1994 | Gersbach et al. | 331/57 |
| 5,349,311 | 9/1994 | Mentzer | 331/57 |
| 5,382,922 | 1/1995 | Gersbach et al. | 331/1 A |
| 5,574,455 | 11/1996 | Hori et al. | 341/144 |
| 5,625,358 | 4/1997 | Wilson et al. | 341/143 |
| 5,654,675 | 8/1997 | Bruccoleri et al. | 331/17 |
| 5,668,503 | 9/1997 | Gersbach et al. | 331/1 A |
| 5,727,038 | 3/1998 | May et al. | 375/376 |
| 5,745,533 | 4/1998 | Asada et al. | 375/354 |
| 5,748,043 | 5/1998 | Koslov | 331/1 A |
| 5,844,447 | 12/1998 | Choi | 331/57 |
| 5,844,954 | 12/1998 | Casasanta et al. | 375/373 |
| 5,856,762 | 1/1999 | Werker et al. | 331/11 |
| 5,892,406 | 4/1999 | Dicke et al. | 331/40 |
| 5,969,552 | * 10/1999 | Lee et al. | 327/158 |

* cited by examiner

*Primary Examiner*—Kenneth B. Wells
*Assistant Examiner*—Cassandra Cox

(57) ABSTRACT

A phase detector and a method for detecting phase difference between two high frequency signals, the phase detector is adapted to receive a reference signal REF, a high frequency signal ICOS, and a signal FD synchronized to ICOS. REF, ICOS and FD have opposite edges. The phase detector comprising of: An asynchronous phase detector circuit, for providing an asynchronous control signal CTP, for representing a time interval between a time of occurrence of an edge of REF and the time of occurrence of a corresponding edge of ICOS. A synchronous phase detector circuit, for providing an synchronous control signal TC, for representing a time interval between a time of the occurrence of the corresponding edge of ICOS and the time of occurrence of a corresponding edge of FD. A combing circuit, for receiving TC and CTP and providing an error signal ERS, representing the phase difference between REF and FD.

14 Claims, 4 Drawing Sheets

-PRIOR ART-

US 6,181,168 B1

HIGH SPEED PHASE DETECTOR AND A METHOD FOR DETECTING PHASE DIFFERENCE

FIELD OF THE INVENTION

A high-speed phase detector and a method for detecting phase difference, and specifically, a phase detector within a phase locked loop.

BACKGROUND OF THE INVENTION

Phase detectors are mainly used in phase locked loops PLLs. Phase detectors detect periodically the phase difference between an externally generated signal and a reference signal to produce an error signal indicating the phase difference between these two signals. The error signal is used to control the frequency of a voltage/current/digital controlled oscillator producing a signal with which the reference signal is synchronized, so as to bring the clock pulse signal into a predetermined phase or frequency relationship, with the external signal.

Both digital PLLs and mixed PLL use digital phase detectors. Digital phase detectors are known in the art for performing such phase detection. In a digital phase detector, the phase difference can be determined as a measure of the number of clock pulses that occur in the period of the received signal. However, this has the disadvantage that the resolution, that is the accuracy, with which the phase difference can be determined depends on the frequency of the clock pulses used.

U.S. Pat. No. 5,105,160 of Summers describes a phase detector that is adapted to operate in relatively low frequencies such as 15 Khz. The phase detector is comprised of a fine resolution analogue phase detector and a coarse resolution digital phase detector. Referring to FIG. 1, combining circuit 20 receives the output signals DES and AES provided by the digital phase detector and analog phase detector and combines DES and AES to produce a resultant digital output signal DPE. DPE represents an overall indication of the phase difference between an external signal VCS and reference signal PL.

The digital phase detector has an up/down counter 6 for counting clock pulses CPS to determine the number of clock pulses that occur in the time interval between opposite edges of a first signal VCS and one edge of a reference signal PL synchronized with the clock pulses CPS. A latch 7 provides a first digital output signal DES which represents the number.

The analogue phase detector circuit having a flip flop 13 for producing a second signal (VCS') which corresponds to the first signal (VCS) and is synchronized with the clock pulses (CPS). Logic gates (XOR gate 9 and AND gate 10) determine the time intervals between corresponding edges of the first and second signals (VCS,VCS'), and a circuit element determines a phase error voltage (VS) from these time intervals. The circuit element comprises of: capacitor 16. Current source 14 for providing a first current I. A charge switch C_SW 17, being controlled by logic circuit 12, for allowing capacitor 16 to be charged by current I from current source 14, during the time intervals between corresponding edges of the first and second signals to produce the phase error voltage across capacitor 16. A discharge switch DC_SW 18, being controlled by logic circuit 12, for allowing capacitor 16 to be discharged, by a discharge current I/N provided by discharge current source 15. The discharge ends when the voltage across capacitor 16 VC reaches a null value. An amplifier 11 is used to compare VC to 0 and notify logic circuit 12 when it occurs. Logic circuit 12 has a circuit for measuring the number of clock pulses CPS that occur during the discharge period and provide this count AES to combining logic 20. The relation N between the two current sources causes the discharge period to be N times longer than the charge period—the time interval between corresponding edges of the first and second signals, thus providing a resolution that is N times better than the digital phase detector.

A disadvantage of this phase detector is that it is suited to operate in relatively low frequencies. This circuit can not operate in high and very high frequencies. For example, the discharge period, and accordingly the resolution of the analogue phase detector are limited by the frequency of the external signal VCS. In the preferred embodiment of the invention the frequency of VCS is about 15 Khz. Thus, such a phase detector can not be effective when VCS is a high frequency signal.

Furthermore, switching C_SW 17 and CS_SW 18 at high frequency and very high frequency results in a high noise level. Yet another disadvantage results from the digitizing of VS. Yet a further disadvantage of the phase detector is its complexity and it being comprised of several elements, like current sources and an amplifier, that their adaptation to operate in high frequencies is relatively expensive.

BRIEF DESCRIPTION OF THE DRAWINGS

While the invention is pointed out with particularity in the appended claims, other features of the invention are disclosed by the following detailed description taken in conjunction with the accompanying drawings, in which:

DETAILED DESCRIPTION OF THE DRAWINGS

It should be noted that the particular terms and expressions employed and the particular structural and operational details disclosed in the detailed description and accompanying drawings are for illustrative purposes only and are not intended to in any way limit the scope of the invention as described in the appended claims.

Figure 1:
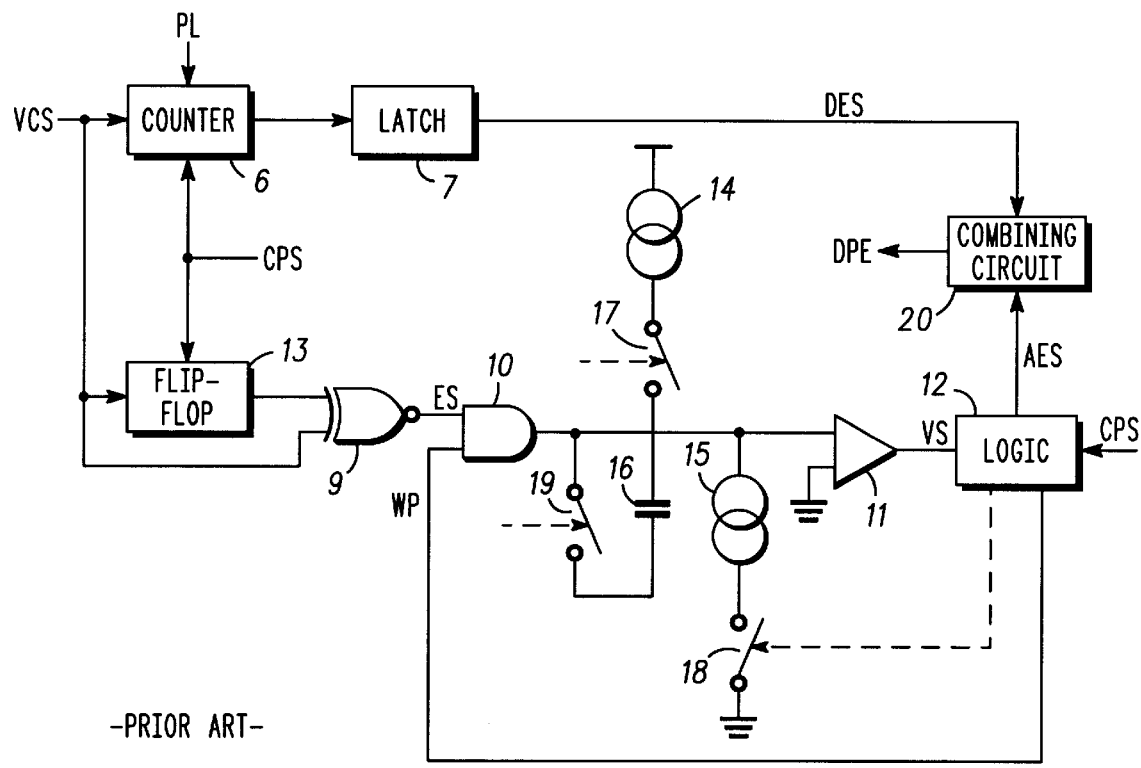
FIG. 1 is a schematic description of prior art phase detector.
Figure 2:
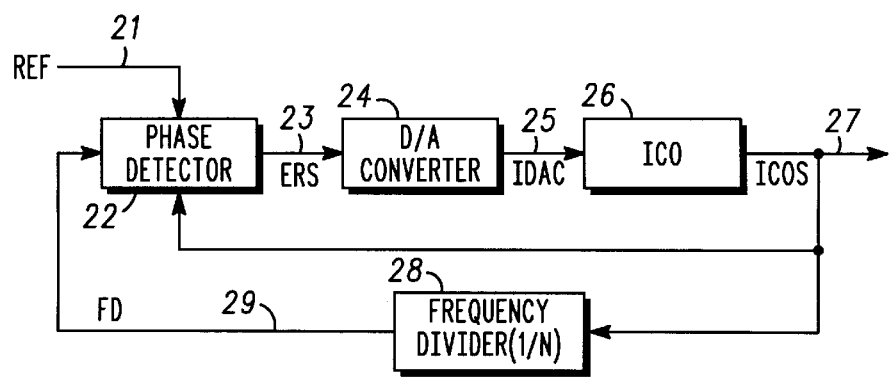
FIG. 2 is a schematic description of a PLL, according to a preferred embodiment of the invention.

FIG. 2 is a schematic description of PLL 8, according to a preferred embodiment of the invention. PLL 8 is comprised of phase detector 22, a digital to analog converter DAC 24, a frequency divider 28 and a current controlled oscillator ICO 26. PLL 8 can also comprise of a VCO or a DCO, but for convenience of explanation it is assumed that ICO is current controlled. Usually, PLL 28 further comprises of a loop filter (not shown in FIG. 2).

Phase detector 22 couple to is DAC 24 via bus 23, to frequency divider 28 via bus 29 and to a reference clock generator (not shown in FIG. 2) via bus 21. ICO 26 is coupled to DAC 24 via bus 25 and to frequency divider 28 by bus 27. The output signals ICOS of PLL 8 are provided by ICO 26, via bus 27. Phase detector 22 receives a reference signal REF from reference clock generator having a frequency of Fref, ICOS having a frequency of Fico from ICO 26, and an output signal FD having a frequency of Ffd, Fdf=(Fico/N) from frequency divider 28. Phase detector 22 outputs, a digital error signal ERS reflecting the phase (frequency) difference between REF amd FD. ERS is received by DAC 24 that converts ERS to an analog signal Idac. Idac is provided to ICO 26 and is used to control Fico.

Conveniently, DAC 24 utilizes a plurality of equally weighted current sources and ERS is provided in a thermometer code. But, other types of DACs and accordingly other types of codes can be used. For example, DAC can utilize a plurality of binary weighted current sources and ERS can be provided in a binary code. BCD code, Gray code, sign-magnitude code, two's complement code, and offset binary code can also be used.

Bus 23 is K bits wide. When the value of ERS is increased/decreased by "1", a single bit out of ERS changes its value accordingly. Preferably, if the value of ERS is "J" then the J bits of ERS are high ("1") and the remaining bits of ERS are low ("0"). Preferably, the J least significant bits of ERS are high. If ERS is increased by 1 then the (J+1)'th least significant bit of ERS changes its value from "0" to "1". For example, if K=26 and J=5 then ERS= 00000000000021211. If the value of ERS is increased by 1 then it equals 00000000000212121, and if it decreases by 1 then it equals 00000000000002121.

DAC 24 receives ERS, whereas a single bit of ERS is used to control a single current source of DAC 24. For example if ERS value is J then J current elements of DAC 24 are activated and Idac is comprised of the sum of currents provided by these J current sources.

Figure 3:
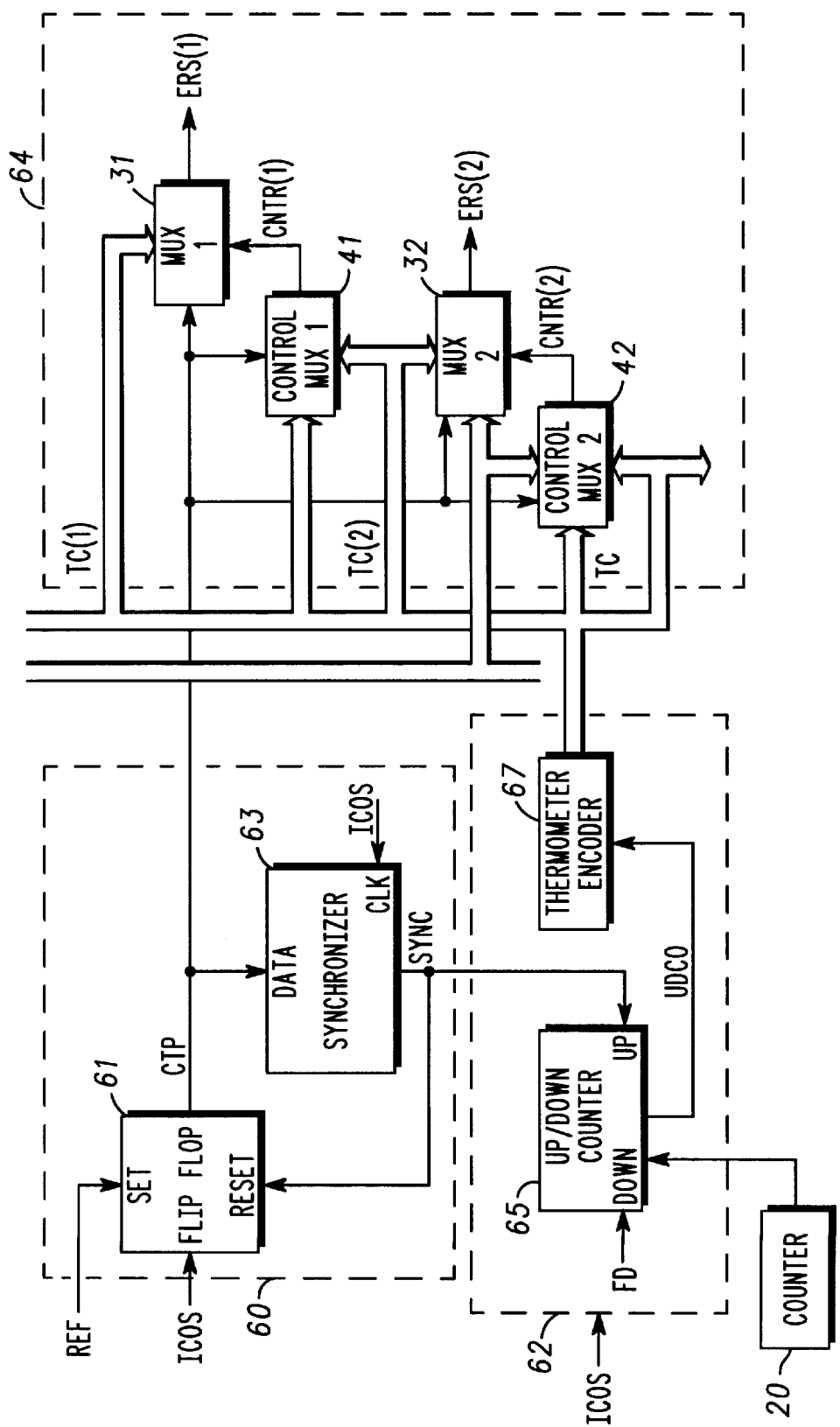
FIG. 3 is a schematic description of a phase detector, according to a preferred embodiment of the invention.
Figure 4:
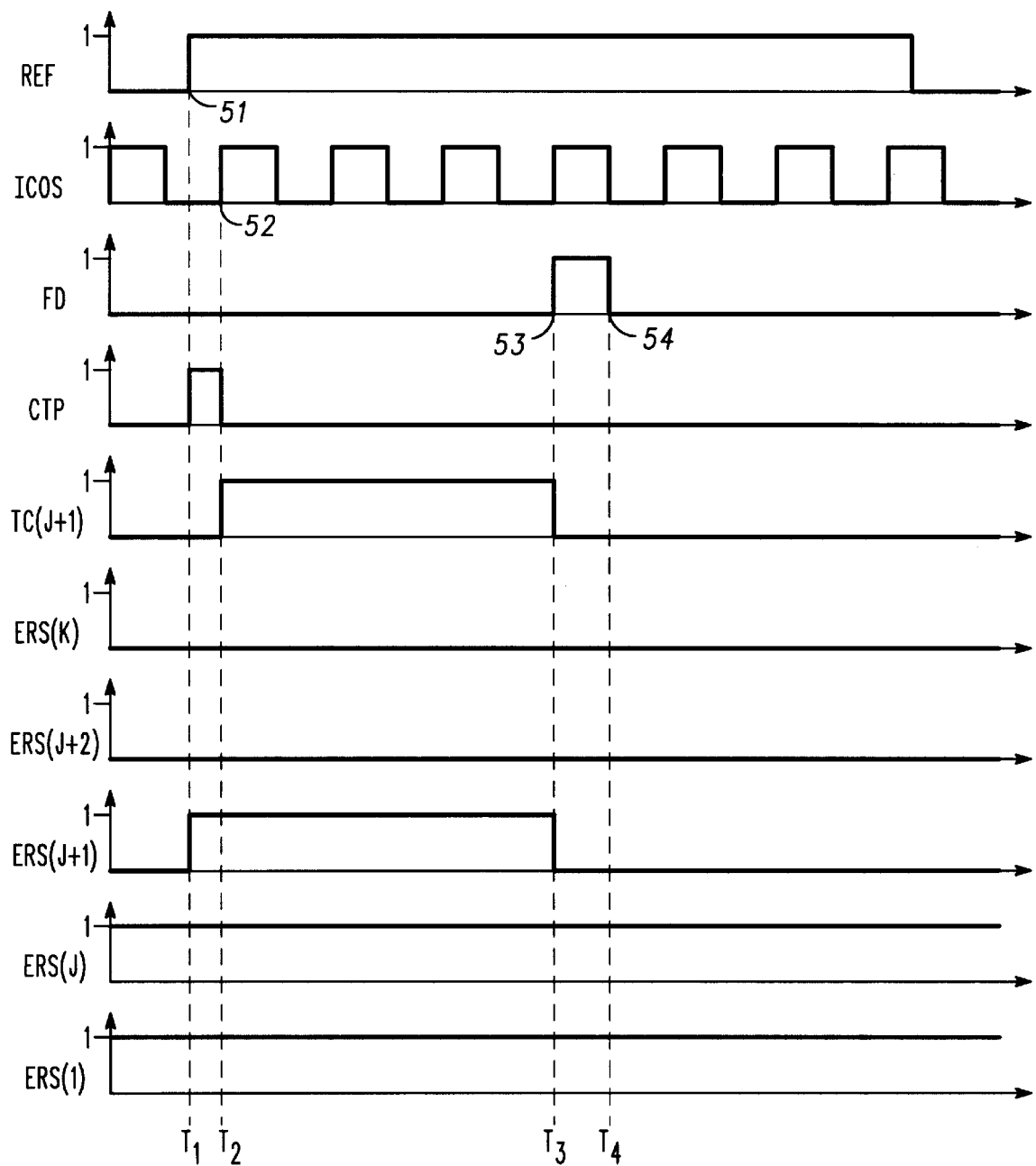
FIG. 4 is a schematic time diagram showing various signals produced in the PLL, according to a preferred embodiment of the invention.

FIG. 3 is a schematic description of phase detector 22 according to a preferred embodiment of the invention. FIG. 4 is a schematic time diagram showing various signals REF, ICOS, FD, CTP, TC(J+1), ERS(K), ERS(J+2), ERS(J+1), ERS(J) and ERS(1) produced in the PLL 8, according to a preferred embodiment of the invention.

Phase detector 22 provides a K-bit error signal ERS, for controlling K current sources within DAC 24. ERS is directly proportional to the time interval between corresponding edges of REF and FD. For convenience of explanation it is assumed that the time interval is measured between corresponding rising edges of REF and FD.

Phase detector 22 is comprised of an asynchronous phase detector circuit 60, a synchronized phase detector circuit 62 and a combiner 64. Asynchronous phase detector circuit 60 provides an asynchronous control signal CTP. CTP represents the time interval between a rising edge of REF and a corresponding edge of ICOS, the first rising edge of ICOS occurring after the rising edge of REF (i.e.—the first ICOS rising edge). Synchronized phase detector circuit 62 provides a synchronized K-bit signal TC. TC is provided in a thermometer code and represents the time interval between the first ICOS rising edge and the corresponding rising edge of FD.

Asynchronous phase detector circuit 60 is comprised of a synchronizer 63 and an asynchronous flip-flop 61, having a SET input, and a RESET input. SET input receives REF and RESET input receives a signal SYNC that resets asynchronous flip-flop 61 in response to the first ICOS rising edge. Thus, asynchronous flip-flop 61 produces CTP which is high "1" in the time interval between the rising edge of REF and the first rising edge of ICOS after the rising edge of REF. Synchronizer 63 can be implemented by a D-flip flop having a DATA input for receiving CTP, a CLOCK input for receiving ICOS and an output for providing a SYNC signal. SYNC signal is used to reset asynchronous flip-flop 61 and for increasing the value of up/down counter 65.

Synchronizer receives CTP and provides a SYNC signal that is synchronized with ICOS. SYNC goes high "1" in response to the rising edge of CTP and the first ICOS rising edge. SYNC goes low "0" in response to the falling edge of CTP and a rising edge of a ICOS that follows the first ICOS rising edge.

SYNC signal is provided to synchronous phase detector circuit 62, for triggering the synchronous phase detection.

Synchronized phase detector circuit 62 is comprised of a synchronous up/down counter (i.e.—counter) 65 and a thermometer encoder 67 for converting the output signal UDCO of counter 65 to TC. TC is provided in a thermometer code.

Counter 65 has an UP input for receiving SYNC, a DOWN input for receiving FD, a CLOCK input for receiving ICOS and an output for providing UDCO. Once counter 20 enables counter 65, the counter will go "up" in response to the rising edge of SYNC and will go "down" in response to a rising edge of FD. Thus, the value of UDCO is incremented by "1" in the time interval between the first ICOS rising edge and the corresponding FD rising edge. UDCO is provided to thermometric encoder 67, that provides TC. In response to the rising edge of UDCO one bit of TC (the (j+1)'th bit) goes "high" and in response to the falling edge of UDCO the (j+1)'th bit goes "low".

Combiner 64 receives CTP and TC and produces a signal ERS. The (J+1)'th bit of ERS goes high in response to the rising edge of CTP and goes low in response to the falling edge of the (J+1)'th bit of TC. Thus, the (J+1)'th bit of ERS is high during the time interval between the rising edge of REF and the rising edge of FD. The relationship between TC, CTP and ERS can be described by the following equation:

$$ERS(J+1)=TC(J+1)*TC(J+2)+(CTP+TC(J+1))*NOT(TC(J+2)).$$

ERS(J+1) being the J'th bit of ERS. TC(J+1) and TC(J+2) being the (J+1)'th and the (J+2)'th bits of TC. Referring to FIG. 4, TC(1)–TC(J) are high, TC(+2)–TC(K) are low. TC(J+1) is high between T2 52 and T3 53. CTP is high between T1 and T2. Thus, before T1 ERS(J+1)=0*0+(0+0)*1=0. Between T1 and T2 ERS(J+1)=0*0+(1+0)*1=1. Between T2 and T3 ERS(J+1)=1*0+(0+1)*1=1. After T3 ERS(J+1)=0*0+(0+0)*1=0.

$$ERS(q)=TC(q)*TC(q+1)+(CTP+TC(q))*NOT(TC(q+1))=1*1+(CTP+1)*0=1, \text{ for } 0<q<J.$$

$$ERS(q)=TC(q)*TC(q+1)+(CTP+TC(q))*NOT(TC(q+1))=0*0+(CTP+0)*1=0, \text{ for } J+1<q<K.$$

Combiner 64 is comprised of K logic circuits. Preferably, the K logic circuits are comprised of K multiplexers MUX1–MUXK 31–39, and K control units 41–49. For convenience of explanation, only two multiplexers (31, 32) and two corresponding control units 41–42 are shown in FIG. 3.

Each multiplexer has a first input for receiving a bit of TC, a second input for receiving CTP, and a control input for receiving a control signal for selecting which of first and second input is coupled to the output of the multiplexer. For example, first multiplexer MUX1 31 receives the first bit TC(1) of TC, CTP and a control signal CNTR(1) from the first control unit 41. MUX1 31 provides the first bit ERS(1) of error signal ERS.

Each control unit has three inputs for receiving CTP, and two consecutive bits of TC. The (J+1)'th control unit receives TC(J+2), TC(J+1) and CTP. The output signal CNTR(J+1) of the (J+1)'th control is low (thus selecting to provide CTP to the output of the (J+1) multiplexer) from T1 till T2—when CTP is high and TC(J+2)=0. After T2, CNTR (J+1) is high (thus selecting to provide TC(J+1) to the output of the (J+1) multiplexer).

Referring to FIG. 3, MUX1 31 receives TC(1), CTP and CNTR(1) and provides ERS(1) and first control unit 41 receives CTP, TC(1) and TC(2) and provides CNTR(1) to MUX1 31. MUX2 32 receives TC(2), CTP and CNTR(2) and provides ERS(2) and first control unit 42 receives CTP, TC(1) and TC(2) and provides CNTR(2) to MUX2 32.

ERS is provided to K bit DAC 24 and is used to achieve a frequency lock, wherein Ffd=Fref.

An aspect of the invention is the usage of a multi-bit (N-bit) up/down counter, that improves the gain of the phase detector, and avoids cutoffs in the range of $-N*\pi$ till $N*\pi$.

A further aspect of the invention is the provision of an error signal ERS in a thermometric code. This allows to couple the phase detector to a digital to analog converter utilizing equally weighted current source. Such a DAC is usually more accurate than a binary weighted DAC, and also assures that an increment in the digital signal provided to the DAC results in an increment in an analog output signal produced by the DAC. Thus, if ERS is increased, Idac increases and the frequency Fico also increases.

Figure 5:
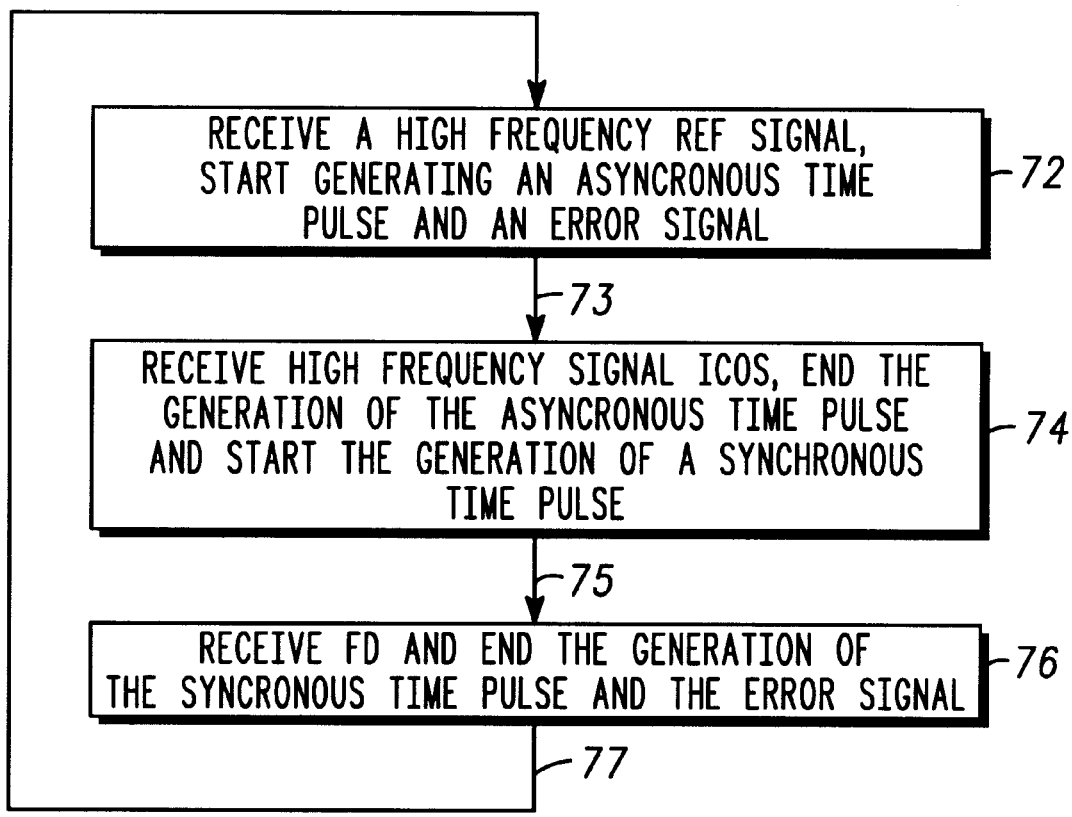
FIG. 5 is a flow chart of a method for detecting phase difference, according to a preferred embodiment of the invention.

FIG. 5 is a flow chart of a method 70 for detecting phase difference, according to a preferred embodiment of the invention. Rectangular boxes 72, 74 and 76 represent steps of method 70. As indicated by paths 73, 75 and 77 steps 72–76 are executed in cyclic manner.

Method 70 comprises of the following steps:

Receiving, during step 72, an edge of an external high-frequency reference signal REF and accordingly starting to generate an asynchronous time pulse CTP, the asynchronous time pulse forms a first part of an error signal ERS. Sending a control signal Idac, corresponding to the asynchronous time pulse, to a ICO 26, for controlling the frequency Fico ICOS of ICO 26. Preferably, the asynchronous time pulse CTP is sent to DAC 24 and is converted to an analog control signal Idac, to be sent to ICO 26.

Receiving, during step 74 a corresponding edge of ICOS, ending the generation of asynchronous time pulse CTP and starting to generate a synchronous time pulse TC. TC forms a second part of an error signal ERS. Sending a control signal Idac, corresponding to TC, to a ICO 26, for controlling the frequency Fico ICOS of ICO 26. Preferably, the asynchronous time pulse CTP is sent to DAC 24 and is converted to an analog control signal Idac, to be sent to ICO 26.

Receiving, during step 76 a corresponding edge of a signal FD, FD is provided by frequency divider 28, FD having a frequency Ffd, Ffd=Fico/N, ending the generation of TC, and accordingly ending the generation of error signal ERS. Jumping to step 72.

Thus, there has been described herein an embodiment including at least one preferred embodiment of an improved phase detector and a method for detecting phase difference between two signals. It will be apparent to those skilled in the art that the disclosed subject matter may be modified in numerous ways and may assume many embodiments other than the preferred form specifically set out and described above. Accordingly, the above disclosed subject matter is to be considered illustrative and not restrictive, and to the maximum extent allowed by law, it is intended by the appended claims to cover all such modifications and other embodiments which fall within the true spirit and scope of the present invention. The scope of the invention is to be determined by the broadest permissible interpretation of the following claims and their equivalents rather than the foregoing detailed description.

We claim:

1. A phase detector adapted to receive a reference signal REF, a high frequency signal ICOS, and a signal FD synchronized to ICOS; wherein REF, ICOS and FD have opposite edges, the phase detector comprising:

an asynchronous phase detector circuit, for providing an asynchronous control signal CTP, for representing a time interval between a time of occurrence of an edge of REF and the time of occurrence of a corresponding edge of ICOS;

an synchronous phase detector circuit, for providing an synchronous control signal TC, for representing a time interval between a time of the occurrence of the corresponding edge of ICOS and the time of occurrence of a corresponding edge of FD;

a combining circuit, for receiving TC and CTP and providing an error signal ERS, representing the phase difference between REF and FD.

2. The phase detector of claim 1 wherein CTP represents the time interval between the time of occurrence of a rising edge of REF and the time of occurrence of a corresponding rising edge of ICOS; and wherein TC represents the time interval between a time of the occurrence of the corresponding rising edge of ICOS and the time of occurrence of a corresponding rising edge of FD.

3. The phase detector of claim 1 wherein the phase detector is coupled to an digital to analog converter, for receiving ERS and producing an analog signal Idac, the analog signal is provided to a current controlled oscillator, coupled to the digital to analog converter and to a frequency divider, for producing ICOS, wherein, ICOS has a frequency of Fico, Fico is responsive to Idac; and wherein the frequency divider is coupled to the phase detector, for providing FD, FD having a frequency of Ffd, Ffd=Fico/N.

4. The phase detector of claim 1 wherein the error signal is provided in a thermometric code.

5. The phase detector of claim 1 wherein the asynchronous phase detector circuit comprises:

an asynchronous flip flop, adapted to receive REF and ICOS, and for providing an output signal CTP having two logic values, CTP has a first level during the time interval between a time of occurrence of an edge of REF and the time of occurrence of a corresponding edge of ICOS; and a synchronizer, coupled to the asynchronous flip-flop and to the synchronous phase detector circuit, for receiving CTP and providing a SYNC signal to the synchronous phase detector circuit, SYNC initializes the generation of TC.

6. The phase detector of claim 5 wherein the synchronous phase detector is comprised of a synchronous up/down counter, adapted to receive FD and SYNC and to provide TC, wherein the value of TC is incremented in response to the reception of SYNC and the value of TC is decremented in response to the reception of an edge of FD.

7. The phase detector of claim 6 wherein the combiner has a K-bit output for providing a K-bit error signal ERS, TC has K bits, TC and ERS are provided in a thermometric code; and wherein a change in the value of TC from J to J+1 causes the combiner to provide CTP to the (J+1)'th output bit of the combiner.

8. A phase locked loop adapted to provide a high frequency signal ICOS, the phase locked loop comprising:
   a current controlled oscillator, adapted to provide a high frequency output signal ICOS having a frequency of Fico, wherein Fico is controlled by a current input signal Idac;
   a frequency divider, coupled to the current controlled oscillator, for receiving ICOS and providing an frequency divider output signal FD, the frequency of FD is Ffd and Ffd=(Fico/N), N>0, REF, ICOS and FD have opposite edges;
   a phase detector, adapted to receive a reference signal REF, ICOS and FD, and to provide an error signal ERS representing the phase difference between REF and FD;
   a digital to analog converter for converting REF to Idac;
   the phase detector comprising of:
   an asynchronous phase detector circuit, for providing an asynchronous control signal CTP, for representing a time interval between a time of occurrence of an edge of REF and the time of occurrence of a corresponding edge of ICOS;
   a synchronous phase detector circuit, for providing an synchronous control signal TC, for representing a time interval between a time of the occurrence of the corresponding edge of ICOS and the time of occurrence of a corresponding edge of FD; and
   a combing circuit, for receiving TC and CTP and providing an error signal ERS.

9. The phase locked loop of claim 8 wherein the error signal ERS is provided in a thermometric code.

10. The phase locked loop of claim 8 wherein the asynchronous phase detector circuit comprises of:
   a asynchronous flip flop, adapted to receive REF and ICOS, and for providing an output signal CTP having two logic values, CTP has a first level during the time interval between a time of occurrence of an edge of REF and the time of occurrence of a corresponding edge of ICOS; and
   a synchronizer, coupled to the asynchronous flip-flop and to the synchronous phase detector circuit, for receiving CTP and providing a SYNC signal to the synchronous phase detector circuit, SYNC initializes the generation of TC.

11. The phase locked loop of claim 10 wherein the synchronous phase detector is comprised of a synchronous up/down counter, adapted to receive FD and SYNC and to provide TC, wherein the value of TC is incremented in response to the reception of SYNC and the value of TC is decremented in response to the reception of an edge of FD.

12. The phase locked loop of claim 11 wherein the combiner has a K-bit output for providing a K-bit error signal ERS, TC has K bits, TC and ERS are provided in a thermometric code; and
   wherein a change in the value of TC from J to J+1 causes the combiner to provide CTP to the (J+1)'th output bit of the combiner.

13. A method for detecting a phase difference between a high frequency reference signal REF and a signal FD, FD and REF have opposite edges, and providing an error signal ERS that reflects the phase difference between REF and FD, the method comprising of the following steps:
   receiving an edge of the high frequency reference signal REF and accordingly starting to generate an asynchronous time pulse CTP, the asynchronous time pulse forms a first part of an error signal ERS;
   receiving a corresponding edge of a high frequency signal ICOS, ending the generation of asynchronous time pulse CTP and starting to generate a synchronous time pulse TC, TC forms a second part of an error signal ERS;
   receiving a corresponding edge of a signal FD, FD is synchronized to high frequency signal ICOS, ICOS having a frequency of Fico, FD having a frequency Ffd, Ffd=Fico/N, and accordingly ending the generation of TC and of error signal ERS; and
   jumping to the step of receiving an edge of the high frequency reference signal REF.

14. The method of claim 13 wherein ICOS is provided by a current controlled oscillator; wherein FD is provided by a frequency divider upon the reception of ICOS; and
   wherein ERS is provided to a digital to analog converter, for producing an analog control current Idac, wherein Fico is controlled by a current input signal Idac.

* * * * *